(12) United States Patent
Song et al.

(10) Patent No.: US 7,569,851 B2
(45) Date of Patent: Aug. 4, 2009

(54) ORGANIC THIN FILM TRANSISTOR ARRAY PANELS

(75) Inventors: Keun-Kyu Song, Yongin-si (KR); Tae-Young Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

(21) Appl. No.: 11/541,254

(22) Filed: Sep. 29, 2006

(65) Prior Publication Data
US 2007/0158651 A1   Jul. 12, 2007

(30) Foreign Application Priority Data
Sep. 30, 2005   (KR)   .................... 10-2005-0091862

(51) Int. Cl.
*H01L 51/10* (2006.01)
(52) U.S. Cl. ............ 257/40; 257/59; 257/E51.006; 349/47
(58) Field of Classification Search ............ 257/40, 257/59; 349/44, 47
See application file for complete search history.

(56) References Cited

U.S. PATENT DOCUMENTS

| 2005/0174503 A1* | 8/2005 | Kim et al. ............ 349/46 |
| 2006/0081849 A1* | 4/2006 | Lee et al. ............ 257/72 |
| 2006/0102905 A1* | 5/2006 | Park ............ 257/72 |

FOREIGN PATENT DOCUMENTS

| JP | 2001-244467 | 9/2001 |
| JP | 2002-359374 | 12/2002 |
| JP | 2003-142692 | 5/2003 |
| JP | 2003-249658 | 9/2003 |
| JP | 2003-295792 | 10/2003 |
| JP | 2004-80026 | 3/2004 |
| KR | 2000-0062886 | 10/2000 |
| KR | 2000-0068763 | 11/2000 |

OTHER PUBLICATIONS

Patent Abstracts of Japan, Publication No. 2001-244467, Sep. 7, 2001, 1 p.
Patent Abstracts of Japan, Publication No. 2002-359374, Dec. 13, 2002, 1 p.

(Continued)

*Primary Examiner*—Minh-Loan T Tran
*Assistant Examiner*—W. Wendy Kuo
(74) *Attorney, Agent, or Firm*—Haynes and Boone, LLP

(57) ABSTRACT

An organic thin film transistor (OTFT) array panel includes a substrate, a data line formed on the substrate, a source electrode connected with the data line, a drain electrode, including a portion facing the source electrode, an insulating layer formed on the source electrode and the drain electrode and having an opening and a contact hole, an organic semiconductor positioned in the opening and at least partially contacting the source electrode and the drain electrode, a gate insulator formed on the organic semiconductor, a stopper formed on the gate insulator, a gate line crossing over the data line and including a gate electrode formed on the stopper, and a pixel electrode connected to the drain electrode through the contact hole.

15 Claims, 15 Drawing Sheets

OTHER PUBLICATIONS

Patent Abstracts of Japan, Publication No. 2003-142692, May 16, 2003, 1 p.
Patent Abstracts of Japan, Publication No. 2003-249658, Sep. 5, 2003, 1 p.
Patent Abstracts of Japan, Publication No. 2003-295792, Oct. 15, 2003, 2 pp.
Patent Abstracts of Japan, Publication No. 2004-080026, Mar. 11, 2004, 1 p.
Korean Patent Abstracts, Publication No. 1020000062886, Oct. 25, 2000, 1 p.
Korean Patent Abstracts, Publication No. 2000-0068763, Nov. 25, 2000, 1 p.

* cited by examiner

ORGANIC THIN FILM TRANSISTOR ARRAY PANELS

RELATED APPLICATIONS

This application claims priority of Korean Patent Application No. 10-2005-0091862, filed Sep. 30, 2005, the entire contents of which are incorporated herein by reference.

BACKGROUND

The present invention relates to methods for making organic thin film transistor array panels.

In general, flat panel displays, such as liquid crystal displays (LCDs), organic light emitting diode (OLED) displays, and electrophoretic displays and the like, include multiple pairs of field generating electrodes and an electro-optical active layer interposed therebetween. LCDs include a layer of a liquid crystal material as the electro-optical active layer, whereas, OLED displays includes an organic emission layer as the electro-optical active layer.

One of the pair of the field generating electrodes is typically connected to a switching element to receive an electrical signal, and the electro-optical active layer converts the electrical signal into an optical signal for displaying an image. Flat panel displays use thin film transistors (TFTs), which are three-terminal elements, as the switching elements, gate lines for transferring scan signals that control the TFTs, and data lines for transfer signals through the TFTs to pixel electrodes formed on the display.

Regarding the TFTs, active research is currently ongoing in the area of organic thin film transistors (OTFTs) that use an organic semiconductor material instead of a conventional inorganic semiconductor, such as Si. Because OTFTs can be fabricated by a solution process at a relatively low temperature, they can be advantageously applied, inter alia, to the manufacture of large-scale flat panel displays which would otherwise be limited as a result of a deposition process used in their manufacture. Additionally, OTFTs can be formed as either a fiber type or a film type, owing to the characteristics of the organic materials used, and accordingly, have received much attention as a core element of flexible display devices.

The methods for manufacturing an OTFT array panel are quite different from those used to make existing TFT array panels in terms of their structure and fabrication methods, and accordingly, it is necessary to provide manufacturing methods that minimize the adverse effects of the fabrication processes on the organic semiconductors during processing, while simultaneously improving the characteristics of the OTFTs.

BRIEF SUMMARY

In accordance with the exemplary embodiments thereof described herein, the present invention provides an organic thin film transistor (OTFT) array panel and a method for manufacturing it that both minimizes the adverse effects of the manufacturing processes on the organic semiconductors during processing and also improves the characteristics of the OTFTs.

In one exemplary embodiment thereof, an OTFT array panel comprises a substrate, a data line formed on the substrate, a source electrode connected with the data line, a drain electrode, including a portion facing the source electrode, and an insulating layer formed on the source electrode and the drain electrode and having an opening and a contact hole. An organic semiconductor is disposed in the opening so as to at least partially contact the source electrode and the drain electrode. A gate insulator is formed on the organic semiconductor, and a stopper is formed on the gate insulator. A gate line that crosses over the data line and includes a gate electrode is formed on the stopper, and a pixel electrode is connected with the drain electrode through the contact hole.

The stopper and the pixel electrode can be comprised of the same material, which can include IZO or ITO, and each is formed in a different layer than the other. The source electrode and the drain electrode can also comprise ITO or IZO. The gate electrode completely covers the stopper.

The OTFT array panel further includes a storage electrode formed in the same layer in which the data line is formed. The drain electrode includes a portion that overlaps the storage electrode. An interlayer insulating layer is formed between the drain electrode and the storage electrode.

The OTFT array panel further includes a light blocking member positioned below the organic semiconductor and formed in the same layer in which the data line is formed. The insulating layer is formed over the entire surface of the substrate, excluding the opening and the contact hole, and can comprise either an organic material or an organic material.

The OTFT array panel may further include a protection member that covers the gate electrode.

In another aspect, the invention provides a method for manufacturing an OTFT array panel that includes forming a data line on a substrate, forming an interlayer insulating layer on the data line, forming a source electrode and a drain electrode on the interlayer insulating layer, and forming a insulating layer having an opening and a contact hole on the source electrode and drain electrode. An organic semiconductor is then formed in the opening, and a gate insulator is formed on the organic semiconductor. A stopper is formed on the gate insulator and a gate line is formed on the stopper and the insulating layer. A pixel electrode is formed so as to connect with the drain electrode through the contact hole on the gate line.

The forming of the organic semiconductor may include performing a surface modification of the insulating layer, forming an organic semiconductor layer, and leaving the organic semiconductor layer on only a portion on which the insulating layer is not formed by the surface modification. During the surface modification of the insulating layer, portions on which the insulating layer is respectively formed and not formed, may each have a different affinity to water. The portion on which the insulating layer is formed may have less affinity to water than the portion on which the insulating layer is not formed. During the surface modification of the insulating layer, a gas containing fluorine may be supplied on the insulating layer to fluorinate the surface thereof.

The forming of the gate insulator may include forming a gate insulating layer and leaving the gate insulating layer on only a portion on which the insulating layer is not formed by the surface modification process.

The exemplary method for manufacturing the OTFT further includes performing a dry etching after the forming of the stoppers. The forming of the insulating layer includes forming an organic film and patterning it, and during the forming of the organic film, the thickness of the film is made greater than the final thickness of the insulating layer after the dry etching. The forming of the gate insulator and the forming of the stopper may include forming the gate insulating layer, forming the stopper, and patterning the gate insulating layer by using the stopper as a mask.

At least one of the forming of the organic semiconductor and the forming of the gate insulator may be effected using an inkjet printing method.

The method may further include forming a protection member over the substrate after the pixel electrodes are formed thereon to protect the underlying structures.

A better understanding of the above and many other features and advantages of the OTFT array panel and the methods for its manufacture may be obtained from a consideration of the detailed description of some exemplary embodiments thereof below, particularly if such consideration is made in conjunction with the appended drawings, wherein like reference numerals are used to identify like elements illustrated in one or more of the figures thereof.

DETAILED DESCRIPTION

Figure 1:
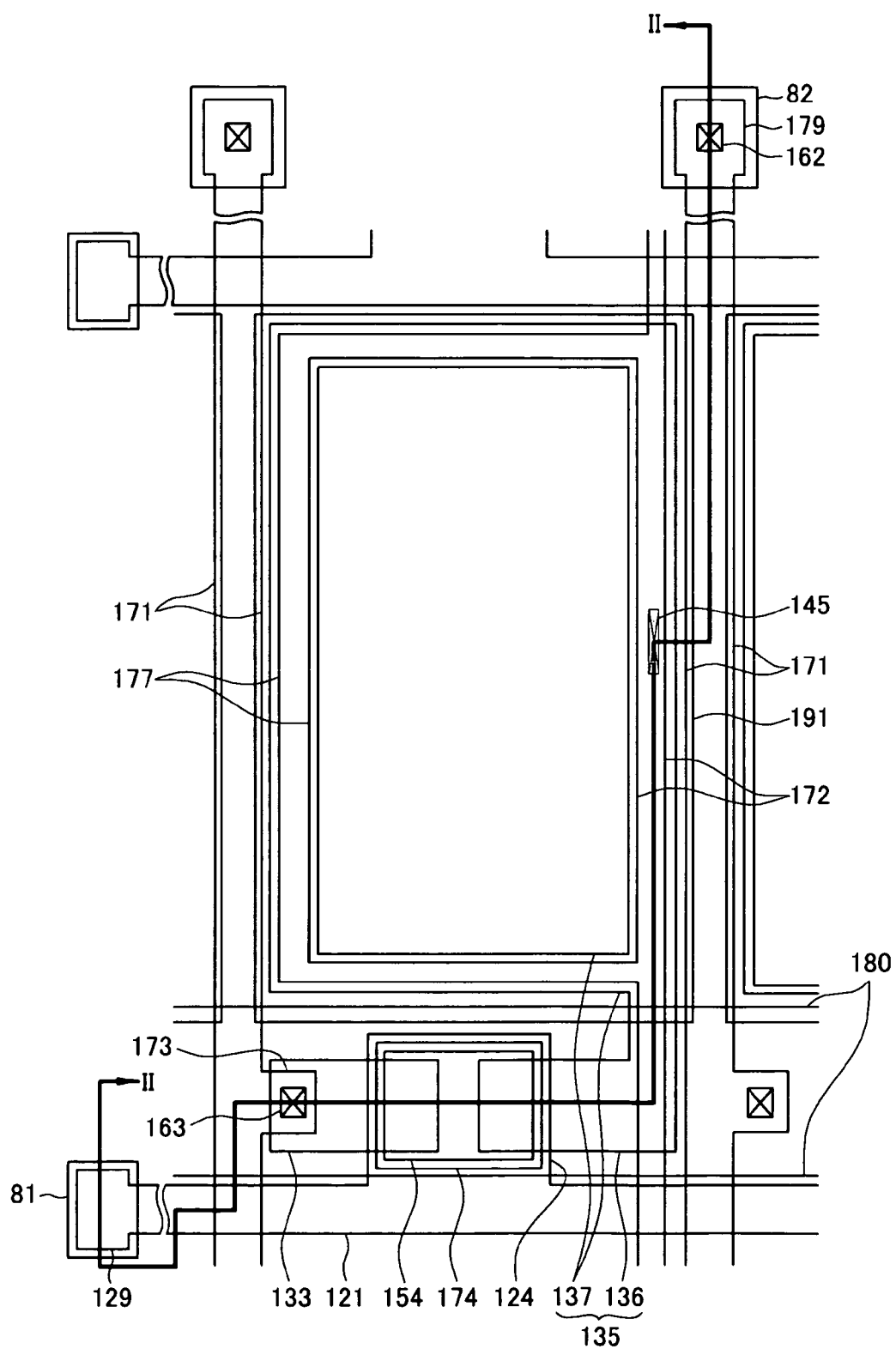
FIG. 1 is a partial top plan view of an exemplary embodiment of an organic TFT array panel in accordance with the present invention, showing a single pixel area thereof.
Figure 2:
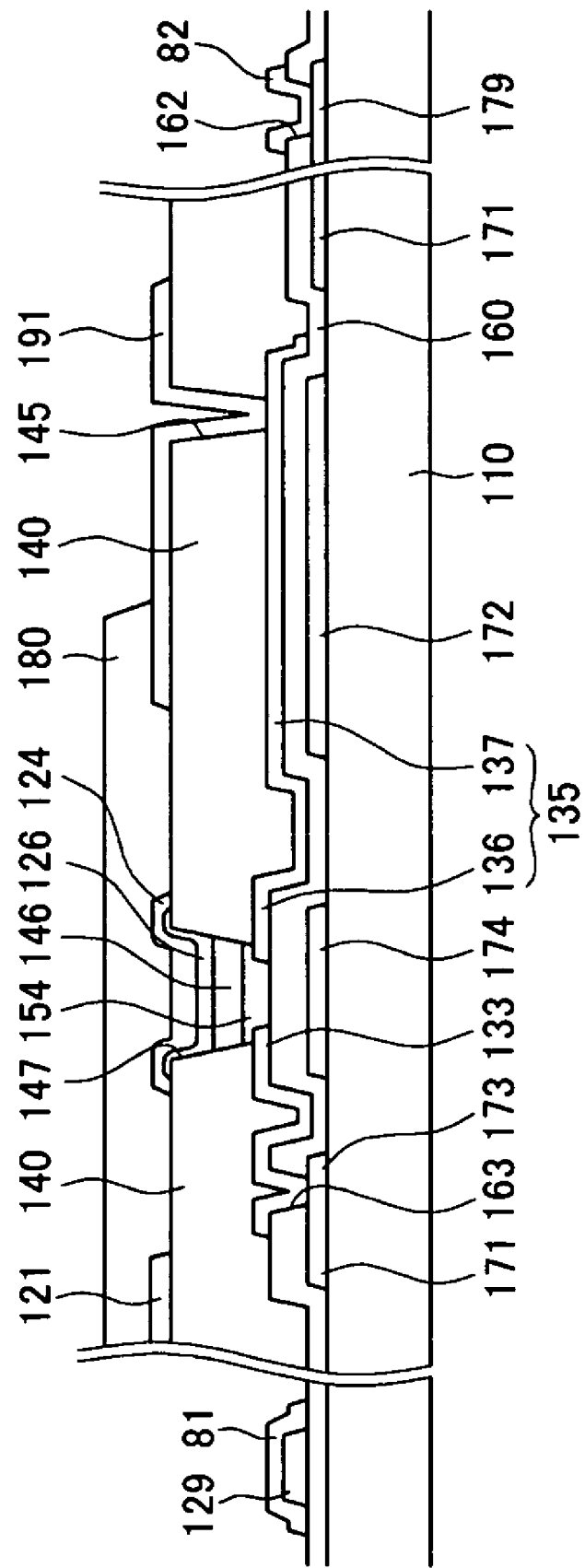
FIG. 2 is a partial cross-sectional view of the exemplary OTFT panel of FIG. 1, taken along lines II-II in FIG. 1.

An exemplary embodiment of an organic thin film transistor (OTFT) array panel in accordance with the present invention is illustrated in the partial top plan of FIG. 1, in which a single pixel area thereof is shown, and FIG. 2 is a partial cross-sectional view of the exemplary OTFT panel taken along lines II-II in FIG. 1.

With reference to FIGS. 1 and 2, a plurality of data lines 171, a plurality of storage electrode lines 172, and a light blocking member 174 are formed on an insulating substrate 110 made of a transparent material, such as glass, silicon, plastic, or the like. The data lines 171 extend generally vertically in FIG. 1, and each conveys a respective data signal. Each data line 171 includes a plurality of projections 173 formed so as to protrude to the side and a large end portion 179 for connection with a different layer or an external driving circuit. A data driving circuit (not illustrated) for generating data signals can be mounted on a flexible printed circuit film (not illustrated) mounted on the substrate 110, or alternatively, can be integrated with the substrate 110 itself, in which case, the data lines 171 can be elongated so as to connect directly therewith.

The storage electrode lines 172 each receive a selected voltage and extend substantially parallel to the data lines 171. Each storage electrode line 172 is positioned between two data lines 171 and is disposed closer to the right one of the two. Each of the storage electrode lines 172 includes a storage electrode 177 that splits toward one side to form a circular shape. However, it should be understood that the storage electrode lines 172 can be modified to incorporate various other shapes and dispositions than those described and illustrated.

The light blocking member 174 is separate from the data lines 171 and the storage electrode lines 172. The data lines 171, the storage electrode lines 172, and the light blocking member 174 can each be made of an aluminum-containing metal, such as aluminum (Al) or an aluminum alloy, a silver-containing metal, such as silver (Ag) or a silver alloy, a gold-containing metal, such as gold (Au) or a gold alloy, a copper-containing metal, such as copper or a copper alloy, a molybdenum-containing metal, such as molybdenum (Mo) or a molybdenum alloy, chromium (Cr), tantalum (Ta), titanium (Ti), as well as a number of other electrically conductive materials.

The data lines 171, the storage electrode lines 172, and the light blocking member 174 can also have a multi-layered structure, including two conductive layers (not shown), each with different physical properties. For example, one of the two conductive layers can made of the aluminum-containing metal, the silver-containing metal, the copper-containing metal, or the like, which has a low resistivity, in order to reduce any signal delay or voltage drop therein. Conversely, the other conductive layer can be made of a material that has good adhesion with the substrate 110, or another material having especially good physical, chemical, and electrical contact characteristics with ITO (Indium Tin Oxide) and IZO (Indium Zinc Oxide), such as a molybdenum-containing metal, chromium, tantalum, titanium, or the like. Good combinations of materials may include, for example, a combination of a lower layer of chromium and an upper layer of aluminum (or alloy thereof), and a combination of a lower layer of aluminum (or alloy thereof) and an upper layer of molybdenum (or alloy thereof). The data lines 171, the storage electrode lines 172, and the light blocking members 174 can also be made of various other metals or conductors. Preferably, the sides of the data lines 171, the storage electrode lines 172, and the light blocking member 174 are sloped at an angle of from about 30° to 80° relative to the surface of the substrate 110.

An interlayer insulating layer 160 is formed over the data lines 171, the storage electrode lines 172, and the light blocking member 174. The interlayer insulating layer 160 can be made of an inorganic insulator, such as silicon nitride ($SiN_x$) or silicon oxide ($SiO_2$), or the like, and have a thickness of from about 2000 Å to 5000 Å. The interlayer insulating layer 160 includes a plurality of contact holes 163 and 162 that expose the projections 173 and the end portions 179 of the data lines 171, respectively.

Respective pluralities of source electrodes 133, drain electrodes 135, and contact assistants 82 are formed on the interlayer insulating layer 160. The source electrodes 133 and the drain electrodes 135 make direct contact with the organic semiconductor, so they are made of a conductive material with a work function that is similar to that of the organic semiconductor, and as a result, the Schottky barrier is thereby lowered so as to facilitate carrier injection and movement. The material can include IZO (indium zinc oxide) or ITO (indium tin oxide) with an exemplary thickness of about 300 Å to 1000 Å.

The source electrodes 133 can be island-type electrodes, and are connected with the data lines 171 through the contact holes 163. Each drain electrode 135 includes a portion 136 (referred to herein as an electrode portion) that faces a source electrode 133 at an upper side of the light blocking member 174, and a portion (referred to herein as capacitor portion) 137 that overlaps an associated storage electrode line 172 at least partially. The electrode portion 136, together with the facing source electrode 133, form a portion of the TFT, and the capacitor portion 137, together with the overlapping storage electrode line 172, form a storage capacitor that functions to strengthen the voltage sustaining capability of an electrode associated with the TFT.

Each contact assistant 82 is connected with a respective end portion 179 of a data line 171 through a contact hole 162, and serves to complement the adhesion between the end portion 179 of the data line 171 and an external device and to protect the end portion.

An insulating layer 140 is formed over the entire surface, including the source electrodes 133, the drain electrodes 135, and the interlayer insulating layer 160. The insulating layer 140 can comprise a photosensitive organic material that enables a solution process to be used for its formation, and has a thickness of from about 5000 Å to 4 μm. The insulating layer 140 has a plurality of openings 147 and a plurality of contact holes 145. Each opening 147 exposes a source electrode 133, a drain electrode 135, and the interlayer insulating layer 160 between a source electrode 133 and a drain electrode 135, and each contact hole 145 exposes a drain electrode 135. A plurality of organic semiconductor islands 154 are formed in the openings 147 of the insulating layer 140.

Each organic semiconductor island 154 contacts a source electrode 133 and a drain electrode 135, and as the organic semiconductor islands 154 are disposed below the insulating layer 140, they are completely confined by the insulating layer 140, which serves as a barrier. Because the organic semiconductors 154 are completely confined by the insulating layer 140, their sides are not exposed, and this arrangement prevents the infiltration of chemical solutions to the sides of the organic semiconductor islands 154 during any subsequent processing.

The organic semiconductor islands 154 are formed at an upper side of the light blocking members 174. The light blocking members 174 serve to block light supplied by a backlight from radiating directly onto the organic semiconductor islands 154, thereby preventing the formation of photovoltaic currents in the organic semiconductor islands 154.

The organic semiconductor islands 154 may have a thickness of from about 300 Å to 3000 Å, and include a polymer or a compound having a low-molecular weight that is dissolved in an aqueous solution or an organic solvent. The organic semiconductor islands 154 may include a derivative, including a substituent, of tetracene or pentacene, or may include an oligothiophene, including four to eight thiophenes connected at second and fifth positions of a thiophene ring.

The organic semiconductor islands 154 may also include polythienylenevinylene, poly 3-hexylthiophene, polythiophene, phthalocyanine, metallized phthalocyanine, or their halogenated derivatives. The organic semiconductor islands 154 may also include perylenetetracarboxylic dianhydride (PTCDA), naphthalenetetracarboxylic dianhydride (NTCDA), or their imide derivatives. The organic semiconductors 154 may include perylene or coronene, and a derivative including their substituents.

A gate insulator 146 is formed over each organic semiconductor island 154. The gate insulator 146 is also disposed below the insulting layer 140 and is thus completely confined by the insulating layer 140, which therefore serves as a barrier. Each gate insulator 146 is made of an organic material or an inorganic material with a relatively high dielectric constant. The organic material may include, for example, a polyimide, a polyvinyl alcohol, a fluorane-containing compound, or a soluble polymer compound, such as parylene, and the inorganic material may include, for example, silicon oxide with a surface-treated with octadecyltrichlorosilane (OTS).

A stopper 126 is formed on each gate insulator 146. The stoppers 126 serve to protect the gate insulators 146 and the organic semiconductor islands 154, and can be made of IZO or ITO.

A plurality of gate lines 121 are formed on the stoppers 126 and the insulating layer 140. Each of the gate lines 121 conveys a respective gate signal and extends in a generally horizontal direction in FIG. 1 so as to cross over the data lines 171 and the storage electrode lines 172. Each gate line 121 includes a plurality of upwardly protruding gate electrodes 124 and a large end portion 129 for a connection with a different layer or an external driving circuit. A gate driving circuit (not illustrated) can be mounted on a flexible printed circuit film (not illustrated) that mounts on the substrate 110, or alternatively, can be integrated with the substrate 110, in which case, the gate lines 121 can extend so as to connect directly with the gate driving circuit.

Each gate electrode 124 overlaps an organic semiconductor island 154, with the gate insulator 146 being interposed therebetween, and is appropriately sized to completely cover the stopper 126 at the upper side thereof. The stoppers 126 strengthen the adhesion between the gate electrodes 124 and the gate insulators 146 and thereby prevent the gate electrodes 124 from being lifted off the substrate.

The gate lines 121 can be made of the same material as the data lines 171 and the storage electrode lines 172. The side of the gate lines 121 are also sloped toward the surface of the substrate 110, and the slope angle is preferably within a range of from about 30° to about 80°.

One gate electrode 124, one source electrode 133, and one drain electrode 135, together with an organic semiconductor island 154, form a thin film transistor, and the channel of the TFT is formed in the organic semiconductor island 154 between the source electrode 133 and the drain electrode 135.

A plurality of pixel electrodes 191 and a plurality of contact assistants 81 are formed on the gate lines 121 and the insulating layer 140. The pixel electrodes 191 and the contact assistants 81 are made of a transparent conductive material, such as IZO or ITO, and may have a thickness of from about 300 Å to 800 Å. Each pixel electrode 191 is connected with a drain electrode 135 through a contact hole 145, and the aperture ratio of the pixel can be increased by arranging it so as to overlap an associated gate line 121 and/or a data line 171.

The pixel electrodes 191 each receive a data voltage from the TFT, together with a common electrode of another display panel (not illustrated), which receives a common voltage, to form an electric field that determines the orientation of the molecules of a layer of a liquid crystal material (not illustrated) disposed between the electrodes. Each pixel electrode 191 and the common electrode together form a capacitor (called a liquid crystal capacitor) that serves to maintain the applied voltage even after the TFT is turned off.

A contact assistant 81 is formed on the end portion 129 of each gate line 121 and serves to complement the adhesion between the end portion 129 and an external device and to protect the end portion.

An optional protection member 180 is formed on the pixel electrodes 191. The protection member 180 protects the OTFTs, and can be formed over only a portion of the substrate or over the entire surface thereof, or can be omitted altogether, according to the particular circumstances at hand.

An exemplary embodiment of a method for manufacturing the OTFT array panel of FIGS. 1 and 2 is described in detail below with reference to FIGS. 3-15. FIGS. 3, 5, 7, 9, 12, and 14 are partial top plan views respectively illustrating sequential, intermediate steps of the method, and FIGS. 4, 6, 8, and 10 are partial cross-sectional views of the panel taken along the lines IV-IV in FIG. 3, VI-VI in FIG. 5, VIII-VIII in FIG. 7, and X-X in FIG. 9, respectively. FIG. 11 is a partial cross-sectional view of the OTFT panel of FIG. 10, showing the results of a subsequent process, and FIGS. 13 and 15 are partial cross-sectional view of the panel taken along the lines XIII-XIII in FIG. 12 and XV-XV in FIG. 14, respectively.

Figure 3:
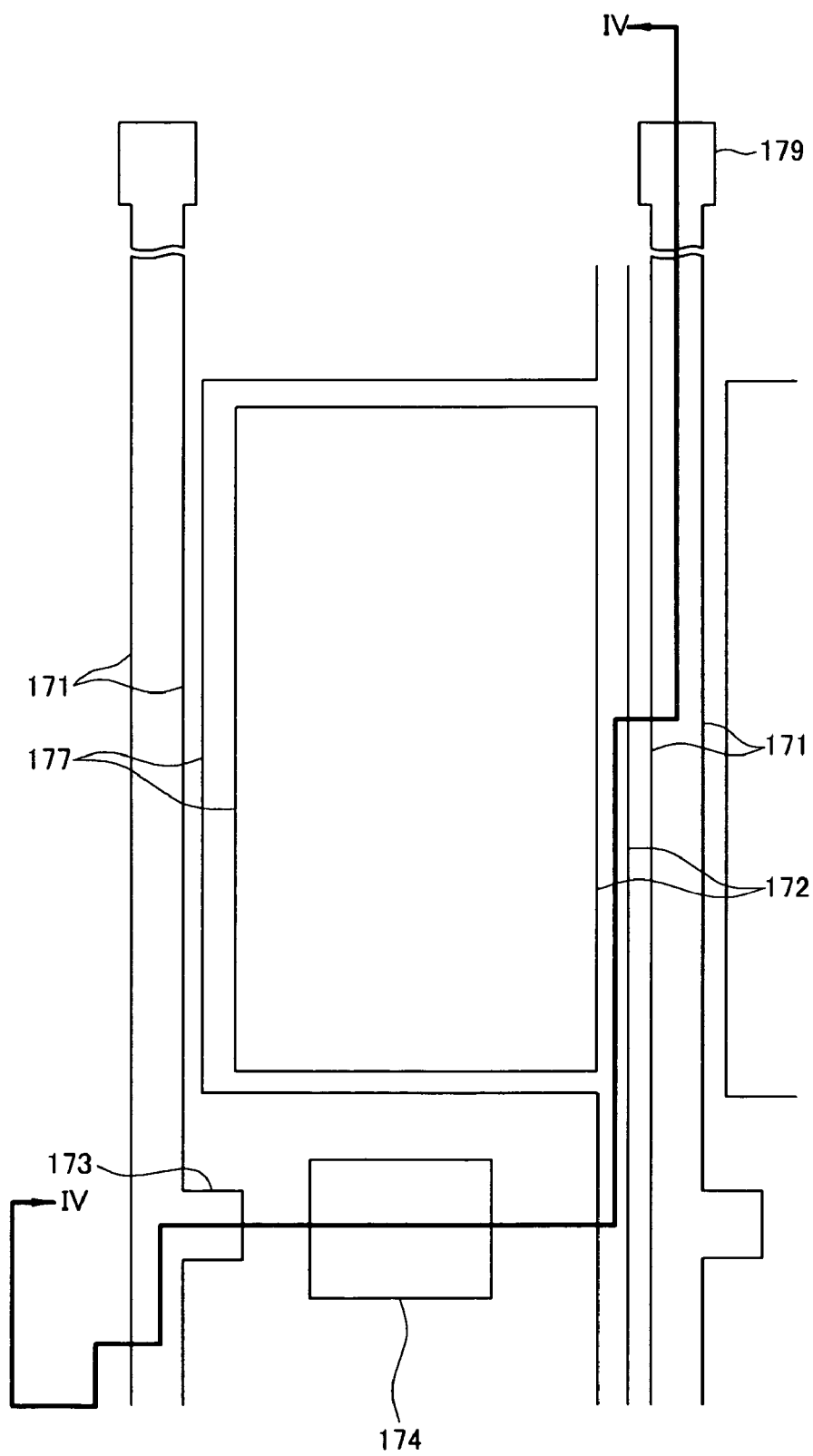
FIGS. 3, 5, 7, 9, 12, and 14 are partial top plan views respectively illustrating sequential, intermediate steps of a method for manufacturing the OTFT array panel of FIGS. 1 and 2 in accordance with an exemplary embodiment of the present invention.
Figure 4:
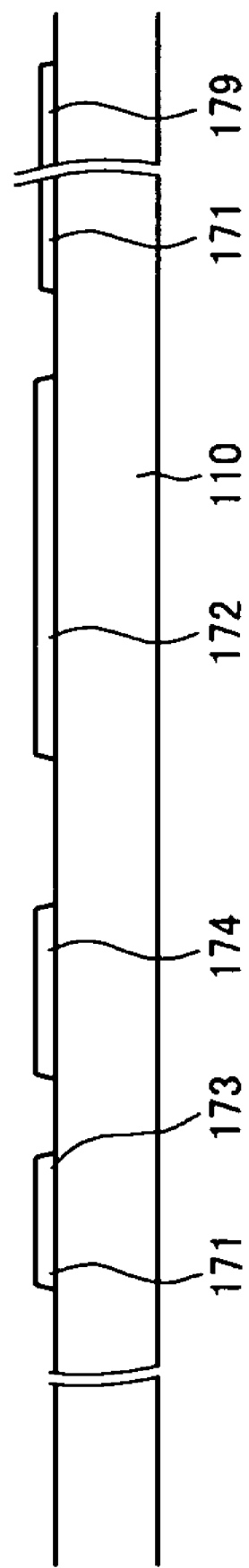
FIG. 4 is a partial cross-sectional view of the panel taken along the lines IV-IV in FIG. 3.

With reference to FIGS. 3 and 4, a conductive layer is first formed on the substrate 110 through a method such as sputtering, and is then subjected to photolithography and etch to form the data lines 171, including the projections 173 and the end portions 179, the storage electrode lines 172, including the storage electrodes 177, and the light blocking members 174.

Figure 5:
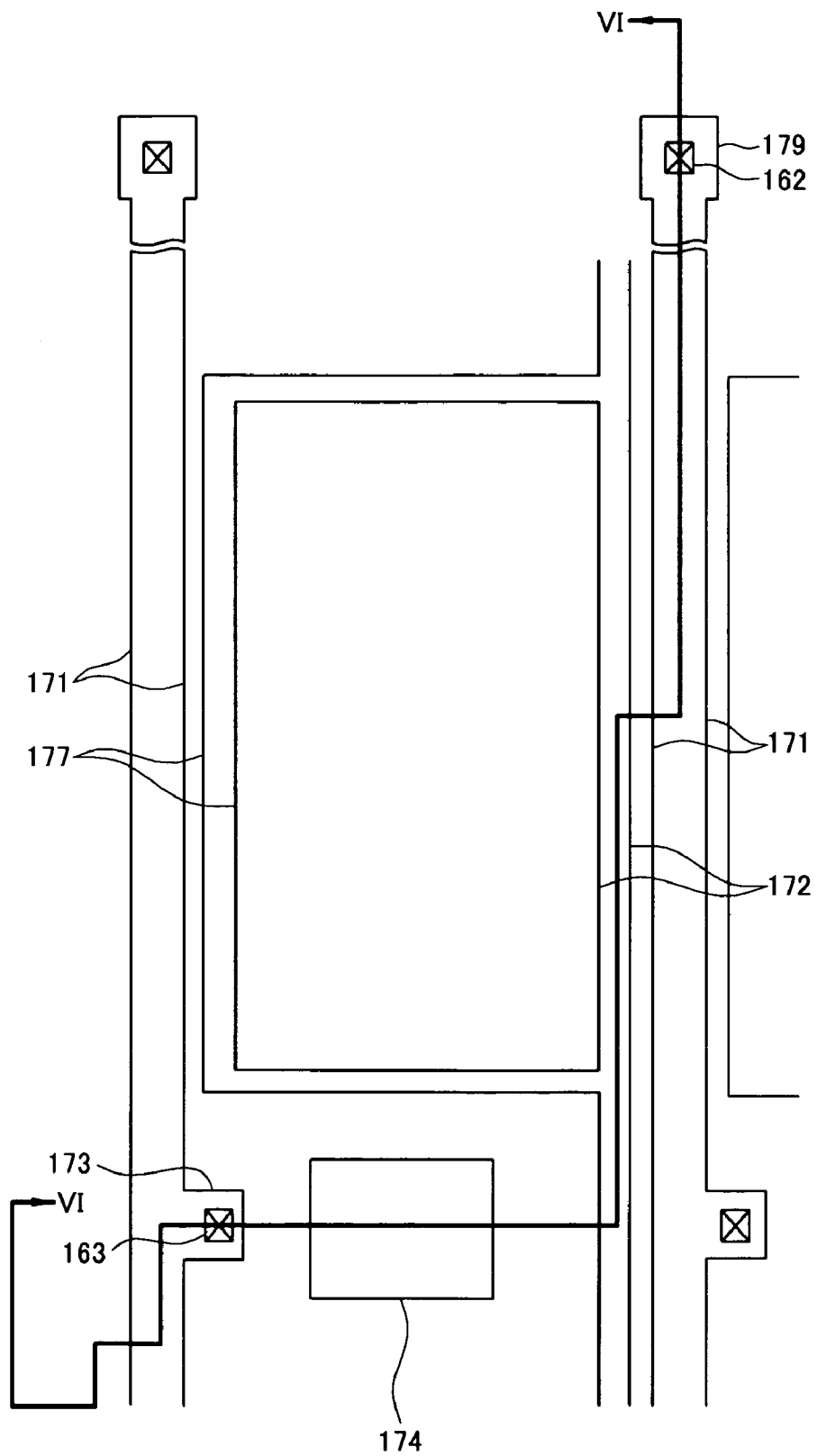
Figure 6:
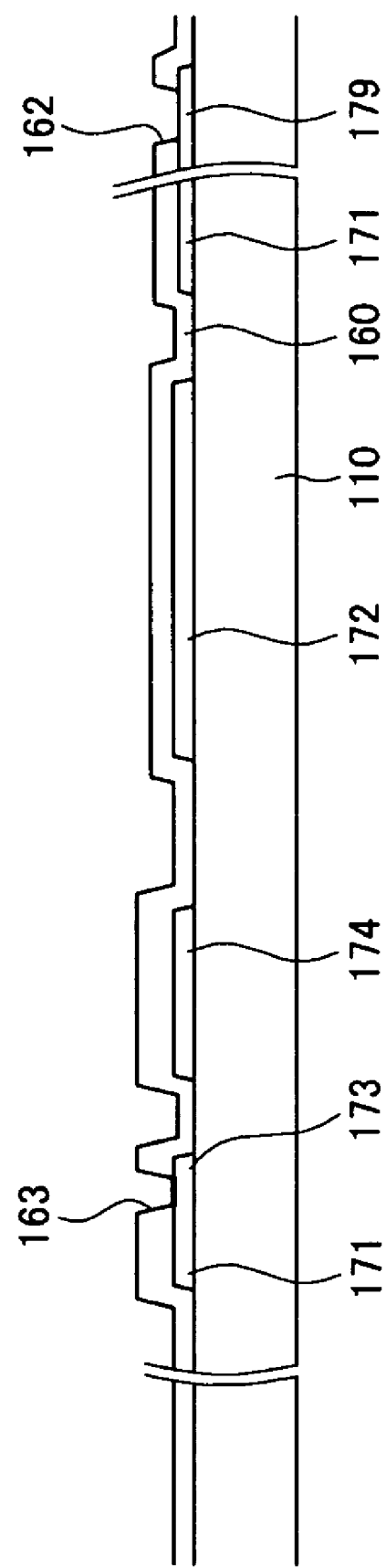
FIG. 6 is a partial cross-sectional view of the panel taken along the lines VI-VI in FIG. 5.

Next, as illustrated in FIGS. 5 and 6, silicon nitride is deposited by chemical vapor deposition (CVD) to form the interlayer insulating layer 160, and a photosensitive film is coated on the interlayer insulating layer 160 and subjected to photolithography and etch to form the contact holes 162 and 163.

Figure 7:
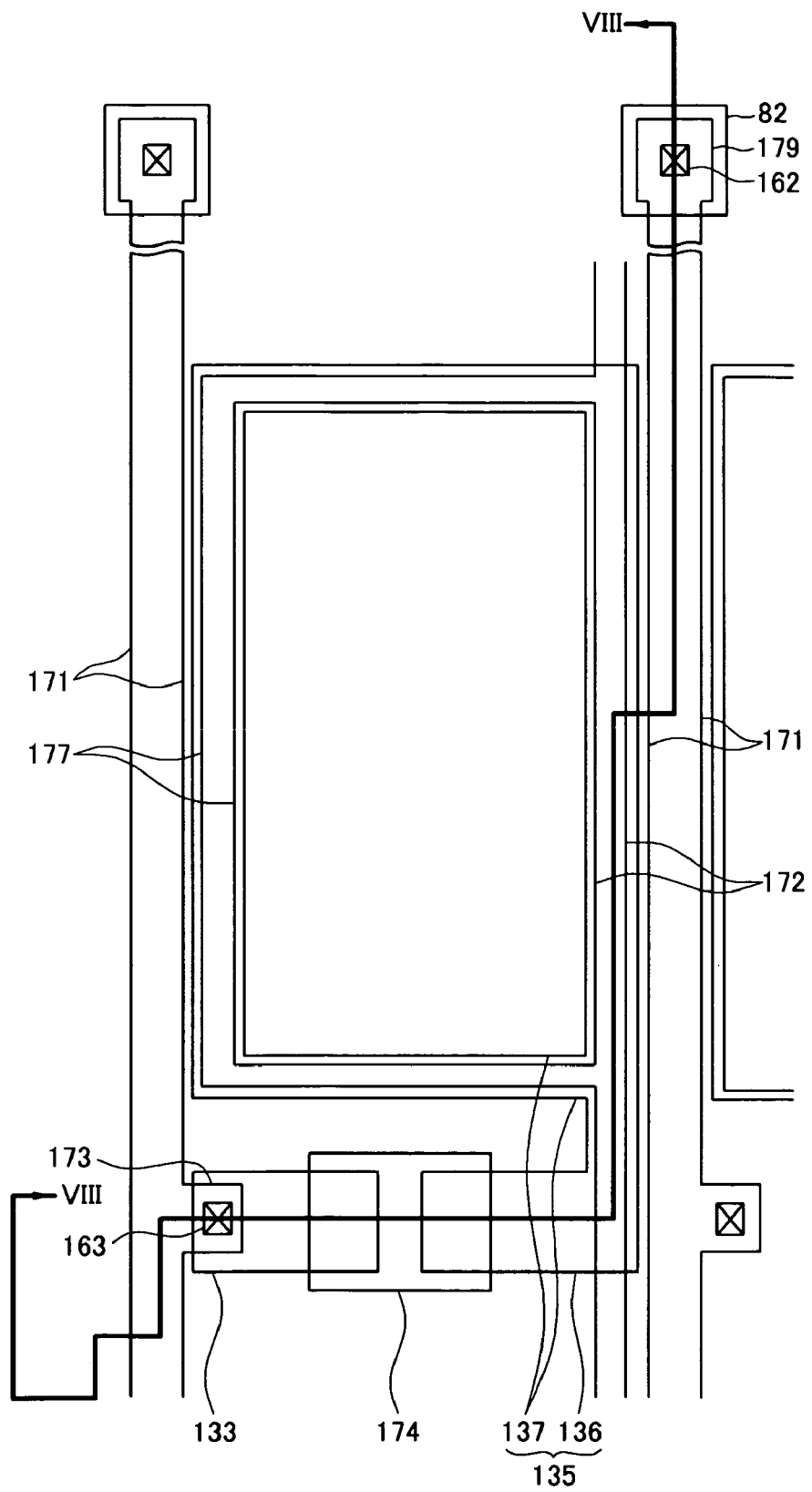
Figure 8:
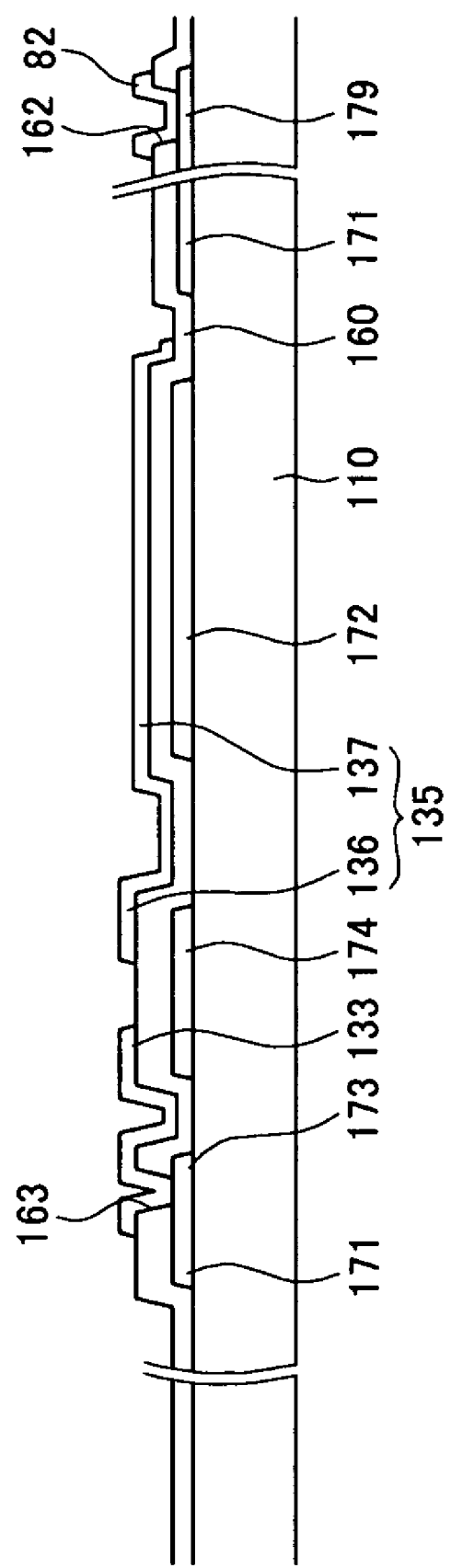
FIG. 8 is a partial cross-sectional view of the panel taken along the lines VIII-VIII in FIG. 7.

Then, as illustrated in FIGS. 7 and 8, ITO or IZO is sputtered onto the substrate and subjected to photolithography and etch to form the source electrodes 133, the drain electrodes 135, and the contact assistants 82.

Figure 9:
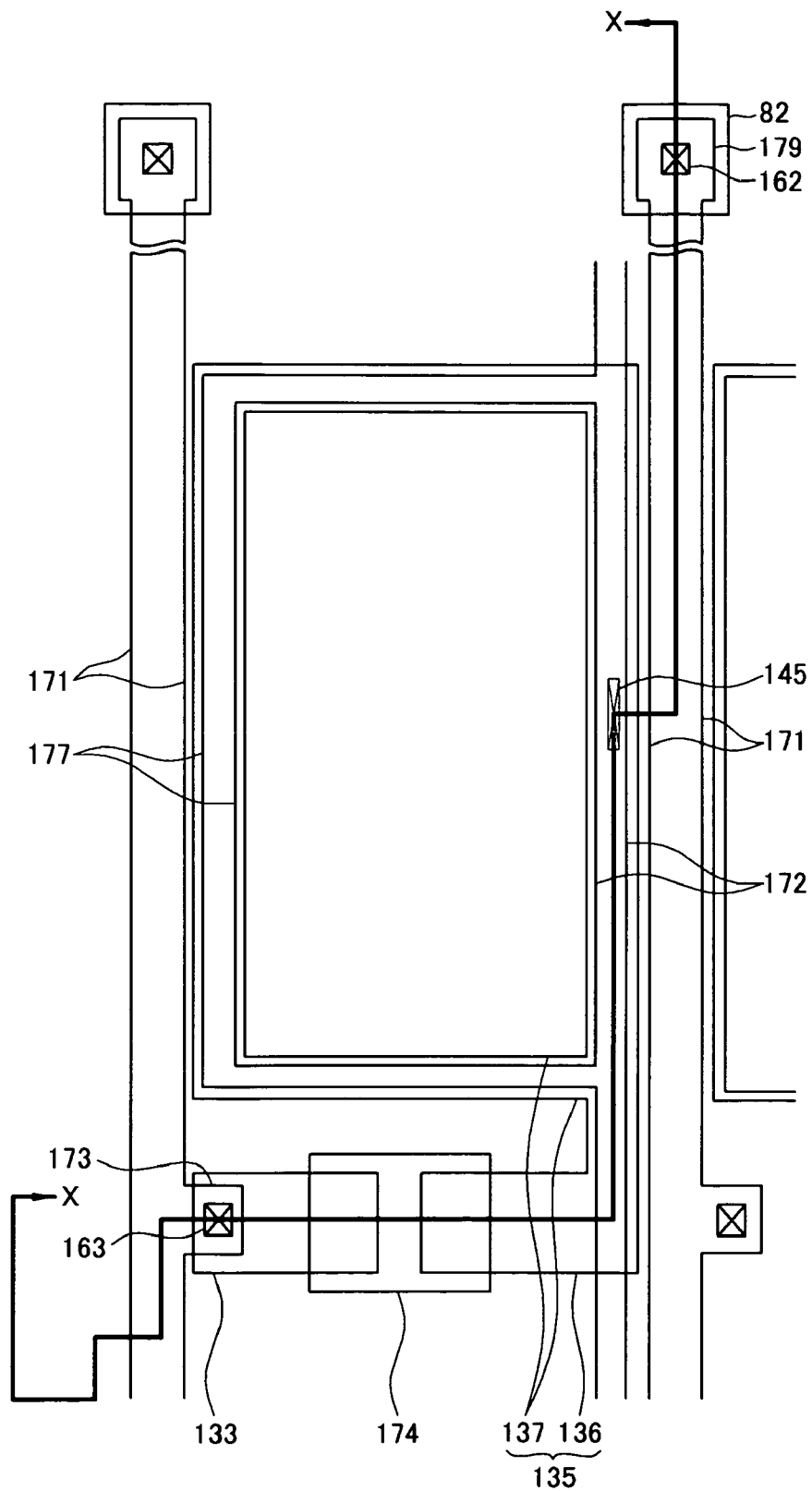
Figure 10:
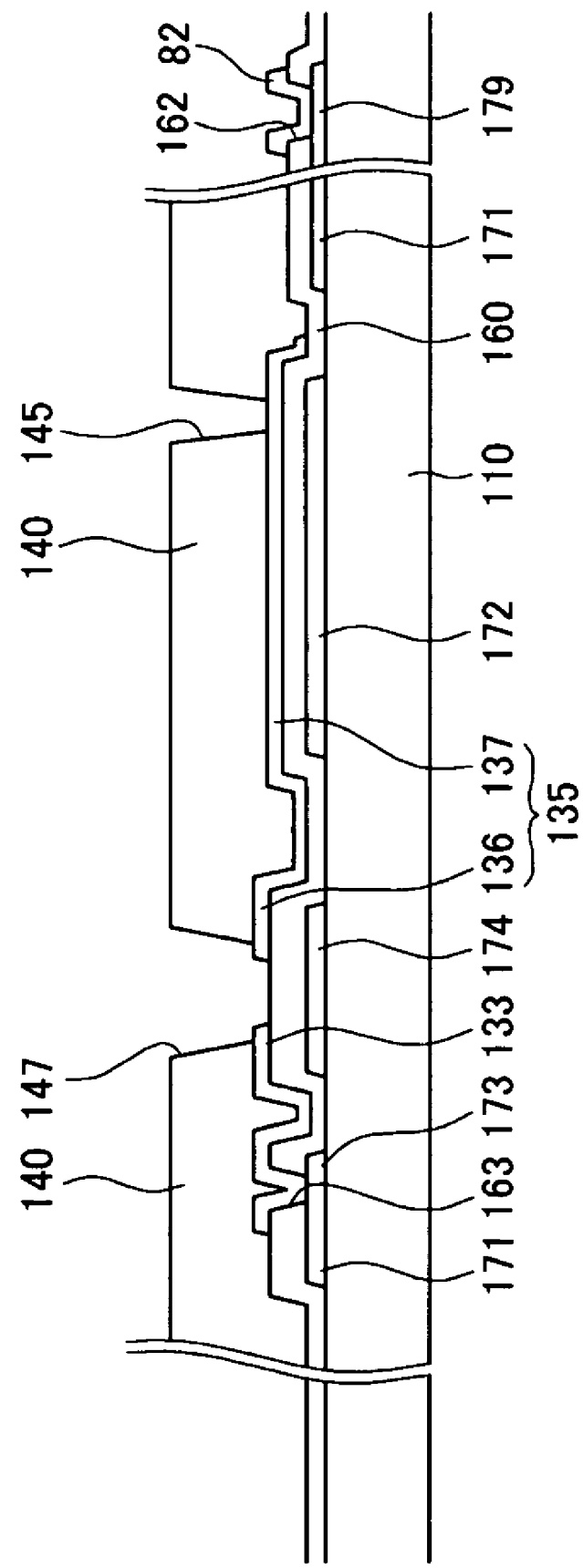
FIG. 10 is a partial cross-sectional view of the panel taken along the lines X-X in FIG. 9.
Figure 11:
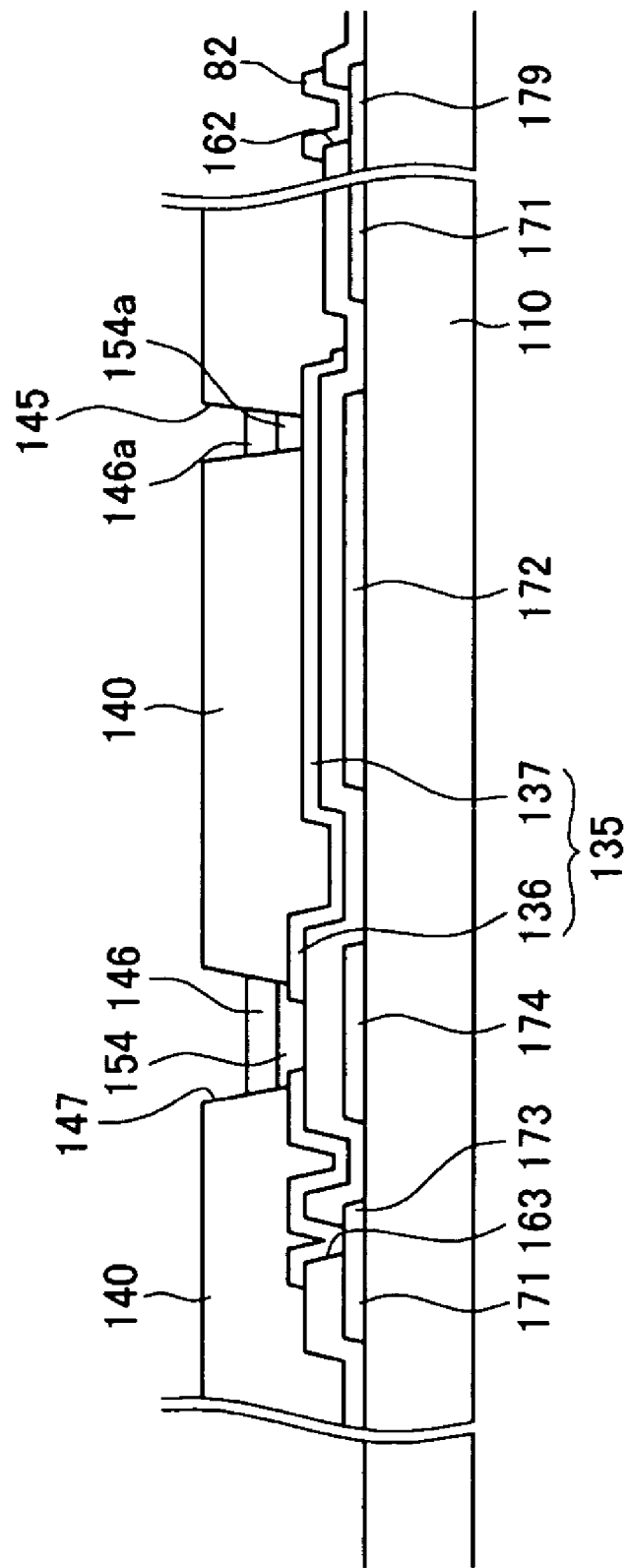
FIG. 11 is a partial cross-sectional view of the OTFT panel of FIG. 10, showing the results of a subsequent process.

As illustrated in FIGS. 9 and 10, a photosensitive organic film is then coated over the entire surface of the substrate and developed to form the insulating layer 140 having a plurality of openings 147 and contact holes 145 therein. In the particular exemplary embodiment illustrated, the insulating layer 140 is formed thicker, e.g., 20,000 Å to 30,000 Å, than the final thickness desired in the layer.

Three methods by which the organic semiconductor islands 154 and the gate insulators 146 may be formed are described below.

In a first exemplary embodiment, an inkjet printing method is employed to inject an organic semiconductor solution into each of the openings 147, and the solution is then dried to form the organic semiconductor islands 154. Subsequently, a gate insulating solution is printed onto the organic semiconductor islands 154 to form the insulators 146 having a selected thickness.

In a second exemplary embodiment, a surface modification method is employed to modify selected portions of the surface of the insulating layer 140. The surface modification employed is a technique for changing the surface of a material to have either hydrophilic or hydrophobic properties by using a plasma. In the exemplary embodiment illustrated, the surface of the insulating layer 140 is fluorinated in a plasma atmosphere. For example, a fluorine-containing gas, such as CF4, C2F6, or SF6, is supplied, together with oxygen gas (O2) and/or an inert gas, in a dry etching chamber. The fluorine (F) in the fluorine-containing gas then bonds to the carbon (C) of the insulating layer 140, which is made of the organic material, such that the insulating layer 140 becomes fluorinated, and because the source electrodes 133, the drain electrodes 135 and the interlayer insulating layer 160 that are exposed through the openings 147 and the contact holes 145 are made of an inorganic material, they are not fluorinated. As a result of the fluorination, the surface of the insulating layer 140 exclusive of the openings 147 and the contact holes 145 is modified so as to become hydrophobic, while the portions exposed through the openings 147 and the contact holes 145 remain relatively hydrophilic.

Next, as illustrated in FIG. 11, the organic semiconductor material is dissolved in a solvent and coated over the entire surface of the substrate by a spin coating or a slit coating process, or alternatively, is injected into the openings 147 by an inkjet printing method. In this embodiment, because the surface of the insulating layer 140 is hydrophobic and the openings 147 and the contact holes 145 are relatively hydrophilic, the hydrophilic organic semiconductor solution collects only in the openings 147 and the contact holes 145.

Then, after the solvent is removed through a drying process, the organic semiconductor islands 154 are formed in the openings 147 and remnants 154a of the organic semiconductor remain in the contact holes 145.

The above-described processes are performed repeatedly to form the gate insulator 146. That is, when the gate insulating solution (not shown) is coated over the entire surface of the substrate, as described above, the solution collects on the organic semiconductor islands 154 in the openings 147 to form the gate insulators 146, and remnants 146a of the gate insulating solution also remain on the organic semiconductor remnants 154a in the contact holes 145.

Thus, by defining hydrophilic and hydrophobic regions on the substrate through the surface modification process, the organic semiconductor islands 154 and the gate insulators 146 can be formed in a very simpler manner, and the array processing time and costs can be correspondingly reduced, as compared with the printing method or a method that uses a shadow mask.

Figure 12:
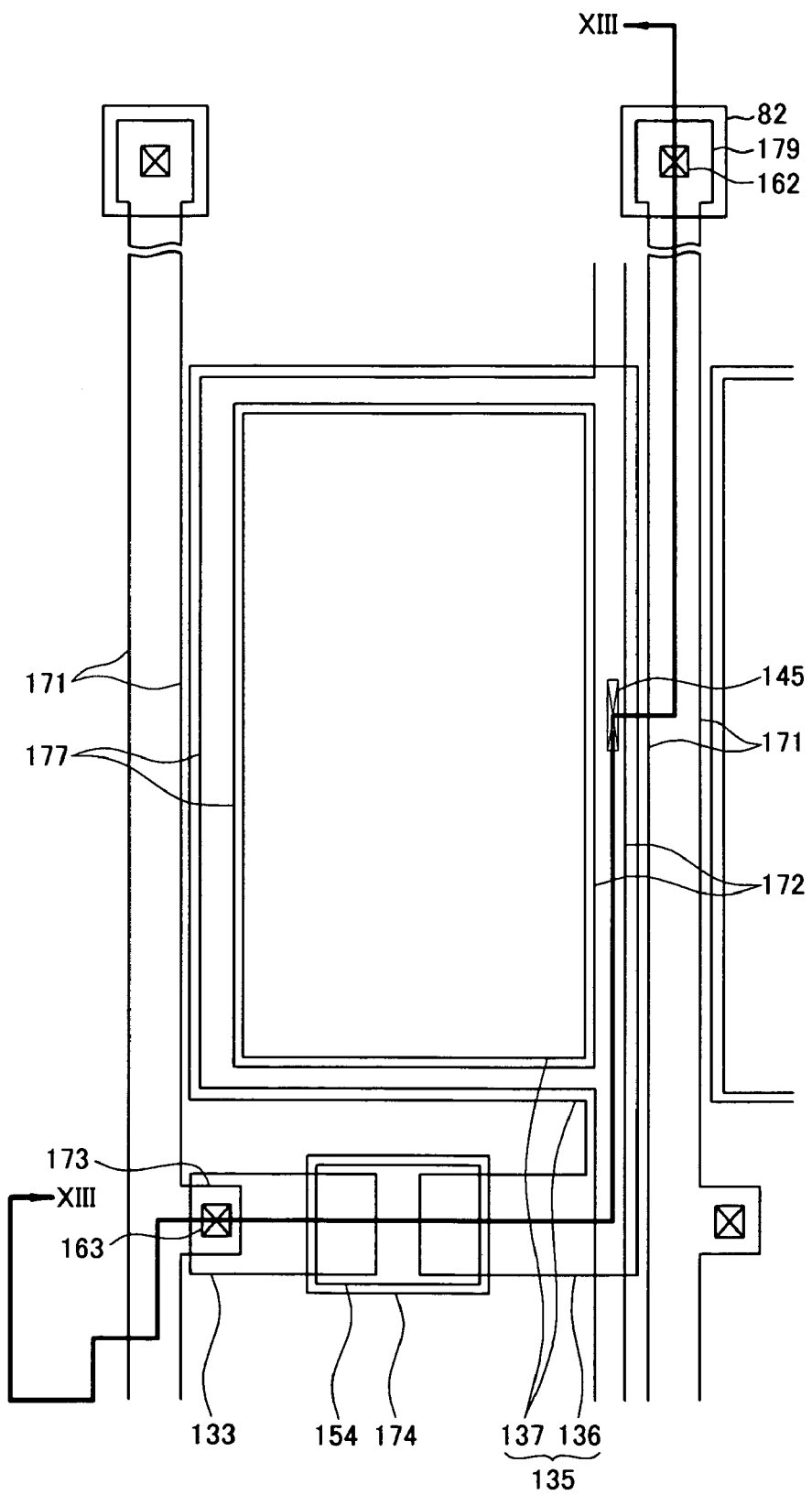
Figure 13:
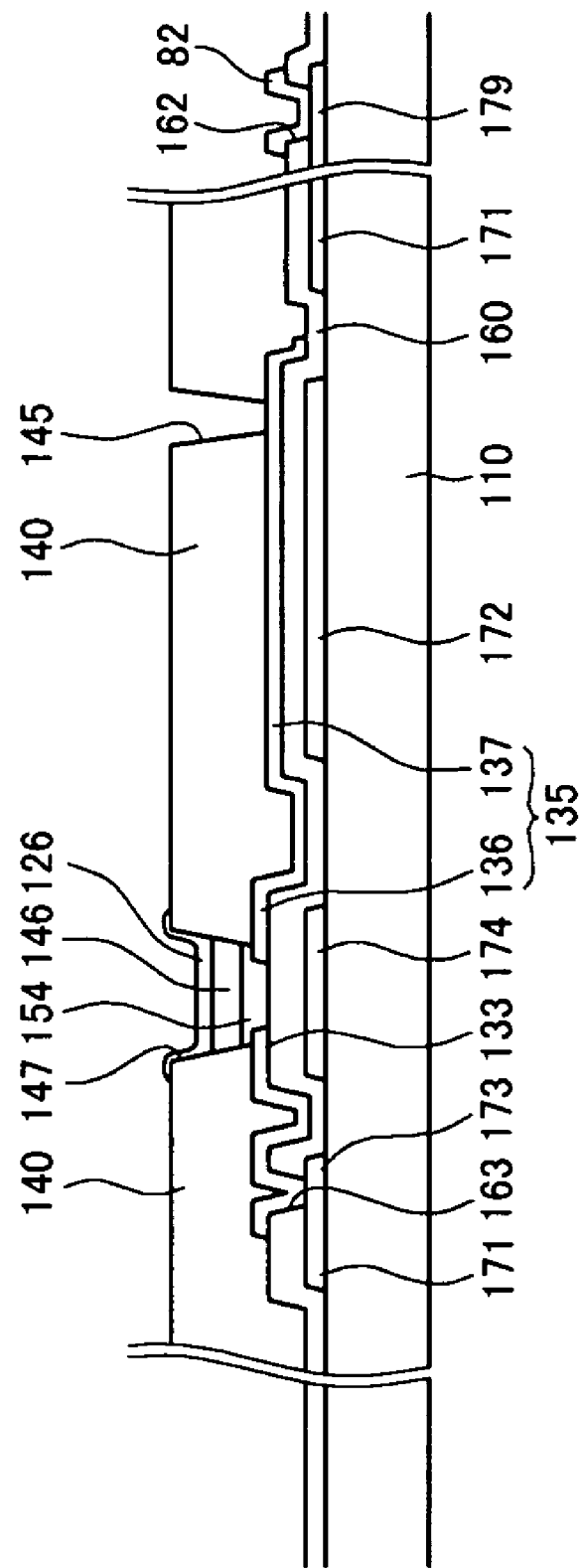
FIG. 13 is a partial cross-sectional view of the panel taken along the lines XIII-XIII in FIG. 12; and, FIG. 15 is a partial cross-sectional view of the panel taken along the lines XV-XV in FIG. 14.

Next, as illustrated in FIGS. 12 and 13, IZO is sputtered on the substrate and subjected to photolithography and etch to form the stoppers 126 that cover the gate insulators 146. Subsequently, the entire surface of the substrate is dry-etched to remove the organic semiconductor remnants 154a and the gate insulating remnants 146a in the contact holes 145. In this instance, because the organic semiconductors 154 and the gate insulators 146 are covered by the stoppers 126, they are not removed by the etching. In addition, the insulating layer 140 is also etched by the dry etching.

In a third exemplary embodiment, e.g., one in which the gate insulators 146 cannot be formed by using the surface modification method above, patterning is performed by using the stoppers 126 as a mask. The insulating layer 140 is surface-modified, and the organic semiconductor islands 154 are formed in the openings 147 and the organic semiconductor remnants 154a are formed in the contact holes 145.

Next, the gate insulating solution is coated over the entire surface of the substrate through a spin coating or a slit coating method. Then, as described above, the stopper 126 is formed with an appropriate size to cover the organic semiconductor islands 154, and the gate insulators 146 are then patterned by using the stoppers 126 as masks. At this time, the organic semiconductor remnants 154 remaining in the contact hole 145 are also removed.

Thus, the organic semiconductor islands 154 and the gate insulators 146 can be formed by any of the three methods s described above.

Figure 14:
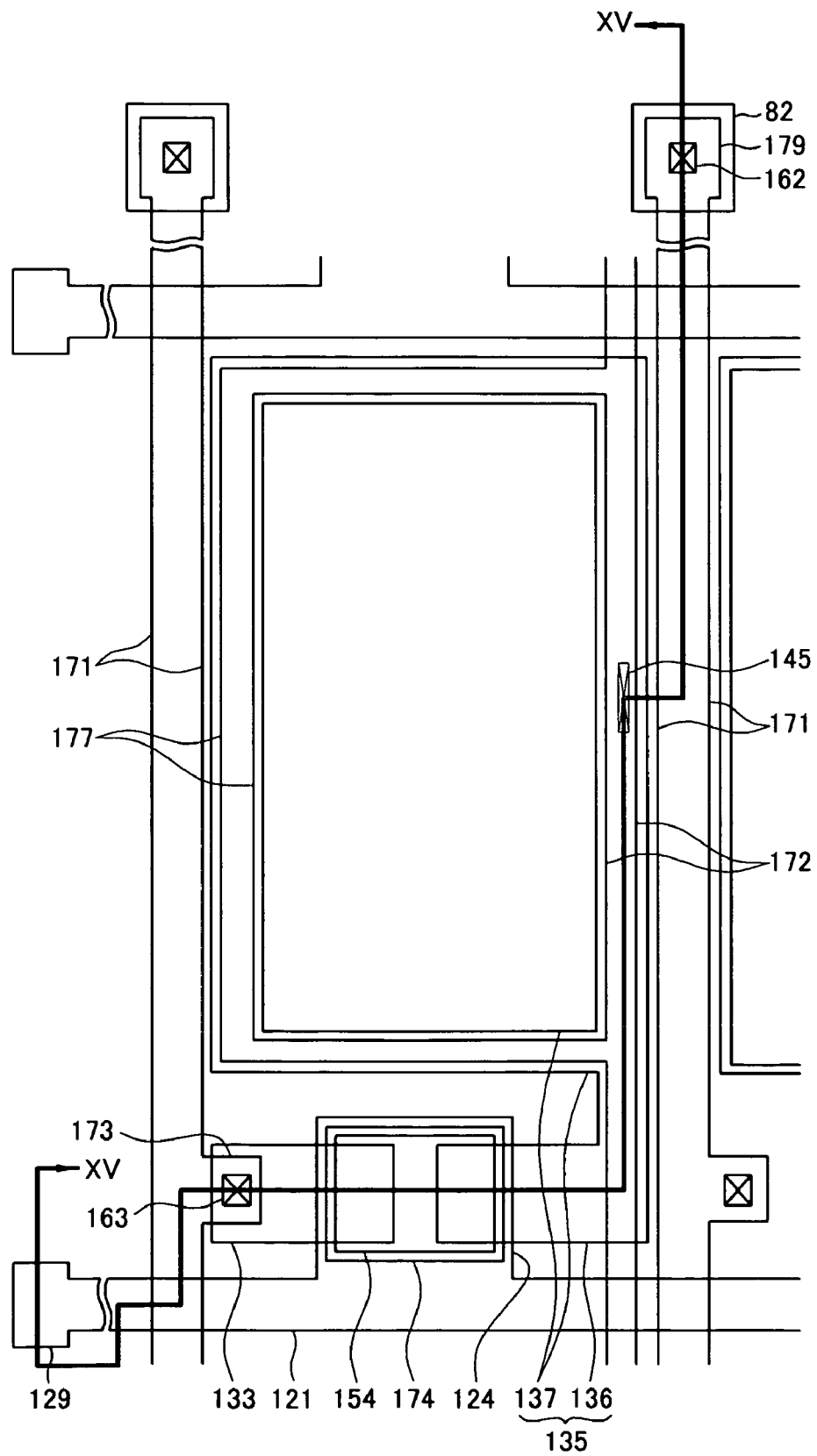
Figure 15:
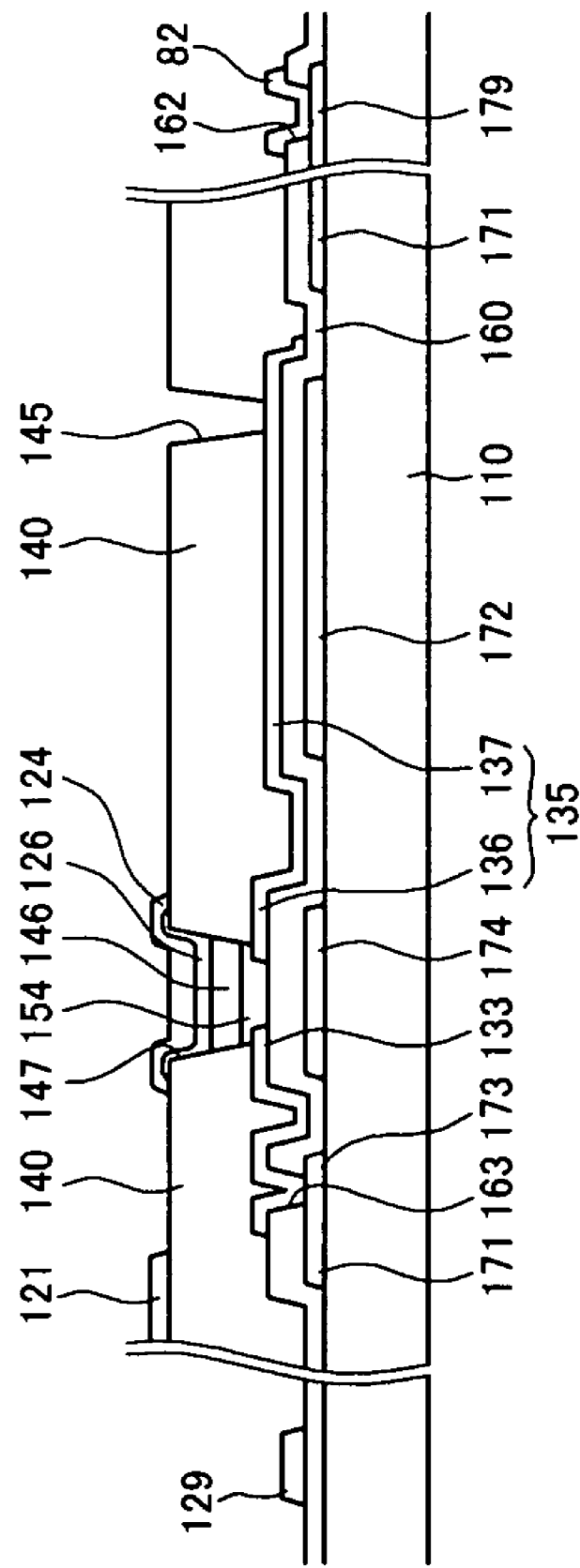

After the organic semiconductor islands 154 and the gate insulators 146 have been formed, the conductive layer is formed through sputtering, or a like process, and is subjected to photolithography and etch to form the gate lines 121, including the gate electrodes 124 and the end portions 129, as illustrated in FIGS. 14 and 15.

In the particular embodiment illustrated, the gate electrodes 124 are sized so as to completely cover the stoppers 126. Because the gate electrodes 124 completely cover the stoppers 126, the chemical solution used during the photolithography and etch process is prevented from flowing to the stoppers 126, which are made of a material with a relatively low chemical resistance, such as ITO or IZO, and thus, the gate insulators 146 and the organic semiconductor islands 154 are protected from being adversely effected by any subsequent processing.

Then, as illustrated in FIGS. 1 and 2, after the IZO or ITO is sputtered, it is subjected to photolithography and etch to form the pixel electrodes 191 and the contact assistants 81. The stopper 126 and the pixel electrodes 191 can be made of the same material, such as IZO or ITO, but of importance, should be formed in different layers. Specifically, the stoppers 126 should be formed before the gate lines 121 are formed, and the pixel electrodes 191 should be formed after the gate lines 121 are formed. This is because the ITO or IZO has a low chemical resistance to etching, and therefore can be easily damaged by the metal etching solution used in the follow-up processes. As discussed above, the stoppers 126 are covered completely by the gate electrodes 124, so they are protected against the etching solution, but the pixel electrodes 191 are exposed and can be easily damaged by the metal etching solution. Therefore, the pixel electrodes 191 are formed after the formation of the gate lines 121, so as to prevent them from being damaged.

In a final step, the optional protection member 180 is formed over the OTFTs, as illustrated in FIG. 2.

As described above, by forming the organic semiconductor islands in the insulating layer and covering them with the stoppers, adverse effects on the organic semiconductors during the subsequent manufacturing processes are thereby minimized, and the characteristics of the OTFTs are improved by including source electrodes and drain electrodes that have good contact characteristics with the organic semiconductors. Additionally, by using the surface modification method described above, the process of forming the organic semiconductors is considerably simplified.

By now, those of skill in this art will appreciate that many modifications, substitutions and variations can be made in and to the OTFT array panel and the methods for making it of the present invention without departing from its spirit and scope. In light of this, the scope of the present invention should not be limited to that of the particular embodiments illustrated and described herein, as they are only exemplary in nature, but instead, should be fully commensurate with that of the claims appended hereafter and their functional equivalents.

What is claimed is:

1. An organic thin film transistor (OTFT) array panel, comprising:
    a substrate,
    a data line formed on the substrate;
    a source electrode connected with the data line;
    a drain electrode comprising a portion that faces the source electrode;
    an insulating layer formed on the source electrode and the drain electrode and having an opening and a contact hole;
    an organic semiconductor positioned in the opening and at least partially contacting with the source electrode and the drain electrode;
    a gate insulator formed on the organic semiconductor;
    a stopper formed on the gate insulator;
    a gate line crossing over the data line and comprising a gate electrode formed on the stopper; and
    a pixel electrode connected with the drain electrode through the contact hole.

2. The OTFT array panel of claim 1, wherein the stopper and the pixel electrode comprise the same material.

3. The OTFT array panel of claim 2, wherein the stopper and the pixel electrode comprise IZO or ITO.

4. The OTFT array panel of claim 3, wherein the stopper and the pixel electrode are formed in different layers.

5. The OTFT array panel of claim 1, wherein the source electrode and the drain electrode comprise IZO or ITO.

6. The OTFT array panel of claim 1, wherein the gate electrode completely covers the stopper.

7. The OTFT array panel of claim 1, further comprising a storage electrode formed on the layer on which the data line are formed.

8. The OTFT array panel of claim 7, wherein the drain electrode comprises a portion that at least partially overlaps the storage electrode.

9. The OTFT array panel of claim 8, further comprising
    an interlayer insulating layer formed between the drain electrode and the storage electrode.

10. The OTFT array panel of claim 1, further comprising a light blocking member positioned at a lower portion of the organic semiconductor and formed on the layer on which the data line are formed.

11. The OTFT array panel of claim 1, wherein the insulating layer is formed over the entire surface of the substrate, excluding the opening and the contact hole.

12. The OTFT array panel of claim 1, wherein the insulating layer comprises an organic material.

13. The OTFT array panel of claim 1, wherein the gate insulator comprises an organic material.

14. The OTFT array panel of claim 1, further comprising a protection member covering the gate electrode.

15. The OTFT array panel of claim 1, wherein a surface of the insulating layer is hydrophobic and portions exposed through the opening and the contact hole are hydrophilic.

* * * * *